United States Patent
Bi et al.

(10) Patent No.: US 10,985,236 B2
(45) Date of Patent: *Apr. 20, 2021

(54) TUNABLE ON-CHIP NANOSHEET RESISTOR

(71) Applicant: International Business Machines Corporation, Armonk, NY (US)

(72) Inventors: Zhenxing Bi, Niskayuna, NY (US); Kangguo Cheng, Schenectady, NY (US); Wei Wang, Yorktown Heights, NY (US); Zheng Xu, Wappingers Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/774,194

(22) Filed: Jan. 28, 2020

(65) Prior Publication Data

US 2020/0168698 A1    May 28, 2020

Related U.S. Application Data

(63) Continuation of application No. 15/958,488, filed on Apr. 20, 2018, now Pat. No. 10,586,843, which is a (Continued)

(51) Int. Cl.
*H01L 21/324* (2006.01)
*H01L 21/02* (2006.01)
(Continued)

(52) U.S. Cl.
CPC .......... *H01L 28/20* (2013.01); *H01L 21/0245* (2013.01); *H01L 21/0259* (2013.01);
(Continued)

(58) Field of Classification Search
CPC ... H01L 27/016; H01L 27/0802; H01L 28/20; H01L 28/24; H01L 45/145; H01L 21/02381; H01L 21/0245; H01L 21/02532; H01L 21/0259; H01L 21/26513; H01L 21/30604; H01L 21/31051; H01L 21/324; H01L 21/02507
(Continued)

(56) References Cited

U.S. PATENT DOCUMENTS 3,897,276 A    7/1975   Kondo
5,243,239 A    9/1993   Khan et al.
(Continued)

OTHER PUBLICATIONS

List of IBM Patents or Patent Applications Treated as Related; (Appendix P), filed Jan. 28, 2020; 2 pages.

*Primary Examiner* — Bo B Jang
(74) *Attorney, Agent, or Firm* — Cantor Colburn LLP; Robert Sullivan

(57) ABSTRACT

A method of forming an integrated circuit device having a nanosheet resistor includes forming a nanosheet structure having alternating sheets of silicon and silicon germanium. An ion implantation is performed on the nanosheet structure. A thermal anneal is performed on the nanosheet structure. A dielectric oxide is placed around the nanosheet structure. A first contact and a second contact are coupled to the nanosheet structure to form a resistor between the first contact and the second contact. Other embodiments are also described herein.

20 Claims, 10 Drawing Sheets

Related U.S. Application Data continuation of application No. 15/246,912, filed on Aug. 25, 2016, now Pat. No. 9,991,328.

(51) Int. Cl.
| | |
|---|---|
| *H01L 21/265* | (2006.01) |
| *H01L 21/306* | (2006.01) |
| *H01L 21/3105* | (2006.01) |
| *H01L 49/02* | (2006.01) |

(52) U.S. Cl.
CPC .. *H01L 21/02381* (2013.01); *H01L 21/02532* (2013.01); *H01L 21/26513* (2013.01); *H01L 21/30604* (2013.01); *H01L 21/31051* (2013.01); *H01L 21/324* (2013.01); *H01L 21/02507* (2013.01)

(58) Field of Classification Search
USPC ........ 257/536, 537, 539, 543, E27.006, E29, 257/176
See application file for complete search history.

(56) References Cited

U.S. PATENT DOCUMENTS

| | | |
|---|---|---|
| 5,793,060 A | 8/1998 | Morikawa |
| 6,359,339 B1 | 3/2002 | Gregor et al. |
| 6,885,055 B2 | 4/2005 | Lee |
| 7,723,200 B2 | 5/2010 | Iben et al. |
| 8,124,490 B2 | 2/2012 | Lin et al. |
| 8,555,216 B2 | 10/2013 | Iben et al. |
| 8,686,292 B2 | 4/2014 | Bulmer et al. |
| 9,231,209 B2 | 1/2016 | Mares et al. |
| 9,349,723 B2 | 5/2016 | Lin et al. |
| 9,991,328 B2 | 6/2018 | Bi et al. |
| 2003/0213998 A1 | 11/2003 | Hsu et al. |
| 2011/0089444 A1 | 4/2011 | Yao et al. |
| 2012/0220102 A1 | 8/2012 | Or-Bach et al. |
| 2014/0016281 A1 | 1/2014 | Zickel et al. |
| 2014/0138601 A1 | 5/2014 | Mares et al. |
| 2015/0076586 A1 | 3/2015 | Rabkin et al. |
| 2015/0123215 A1 | 5/2015 | Obradovic et al. |
| 2015/0263095 A1 | 9/2015 | Chan et al. |
| 2018/0061929 A1 | 3/2018 | Bi et al. |
| 2018/0240858 A1 | 8/2018 | Bi et al. |

A-A'

C-C'

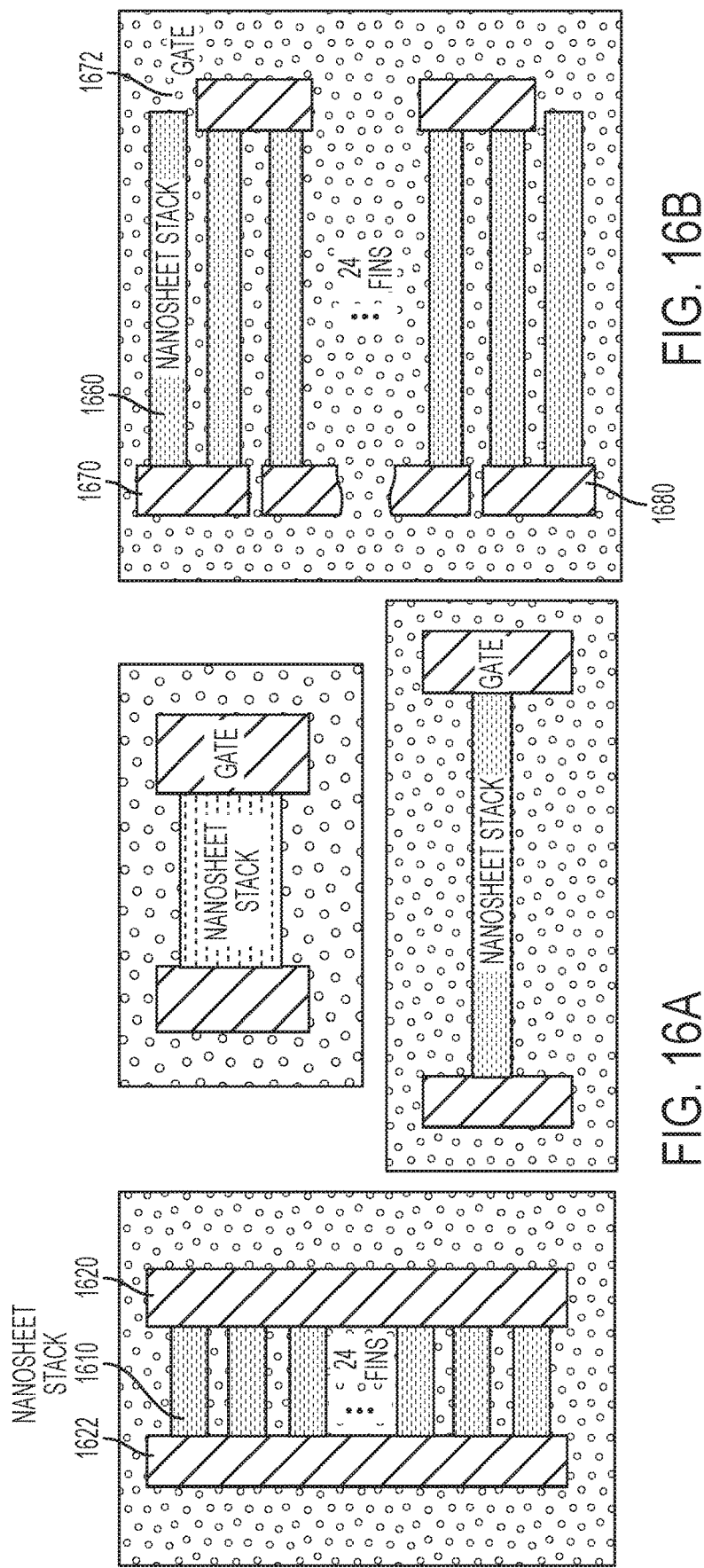

TUNABLE ON-CHIP NANOSHEET RESISTOR

DOMESTIC PRIORITY

This application is a continuation of U.S. application Ser. No. 15/958,488, entitled "TUNABLE ON-SHIP NANOSHEET RESISTOR", filed on Apr. 20, 2018, which is a continuation of U.S. Pat. No. 9,991,328, entitled "TUNABLE ON-CHIP NANOSHEET RESISTOR", filed Aug. 25, 2016, which is incorporated herein by reference in its entirety.

BACKGROUND

The present invention relates in general to integrated circuit device structures and their fabrication. More specifically, the present invention relates to the fabrication and resulting structures of nanosheet resistors in integrated circuit devices.

Integrated circuits include multiple devices and electronic circuits on one small chip formed primarily of semiconductor material. A typical integrated circuit device includes many different types of devices, including transistor, resistors, capacitors, diodes, and the like. These devices usually are formed in various doped regions of the integrated circuit device. A resistor is typically formed using one type of transistor region (such as an n-type region or a p-type region) or by using a poly region of a transistor. As the feature size of integrated circuits becomes smaller (e.g., 7 nm and smaller), traditional methods of forming resistors in integrated circuits becomes cumbersome, as a resistor can occupy too much space to be useful.

SUMMARY

Embodiments are directed to a method of forming a resistor in an integrated circuit device. The method includes forming a nanosheet structure having alternating sheets of silicon and silicon germanium. An ion implantation is performed on the nanosheet structure. A thermal anneal is performed on the nanosheet structure. A dielectric oxide is placed around the nanosheet structure. A first contact and a second contact are coupled to the nanosheet structure to form a resistor between the first contact and the second contact.

Embodiments are also directed to an integrated circuit device that includes a substrate and at least one resistor formed over the substrate. The resistor is formed by forming a nanosheet structure having alternating sheets of silicon and silicon germanium. An ion implantation is performed on the nanosheet structure. A thermal anneal is performed on the nanosheet structure. A dielectric oxide is placed around the nanosheet structure. A first contact and a second contact are coupled to the nanosheet structure to form a resistor between the first contact and the second contact.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 16A depicts an exemplary coupling of multiple nanosheet resistors; and

FIG. 16B depicts an exemplary coupling of multiple nanosheet resistors.

DETAILED DESCRIPTION

It is understood in advance that although a detailed description of an exemplary resistor configuration is provided, implementation of the teachings recited herein are not limited to the particular resistor structure described herein. Rather, embodiments of the present invention are capable of being implemented in conjunction with any other type of integrated circuit device, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of forming a resistor using nanosheet technology in an integrated circuit structure.

As semiconductor feature sizes become smaller, conventional methods of forming resistors in an integrated circuit becomes impractical. The size can be too large or they can suffer from poor control. In addition, there can be extra masks needed for certain steps, thus incurring extra steps in the fabrication process, which is not desirable.

Turning now to an overview of the present invention, one or more embodiments form an integrated circuit resistor using nanosheet technology. The use of nanosheet technology to form resistors in integrated circuits provides a dielectric isolation between a nanosheet resistor stack and the substrate, which allows for tuning the resistance at a higher level of precision. In addition, the formation of a nanosheet resistor is compatible with standard nanosheet formation techniques. Thus, additional processing steps can be avoided.

Figure 1:
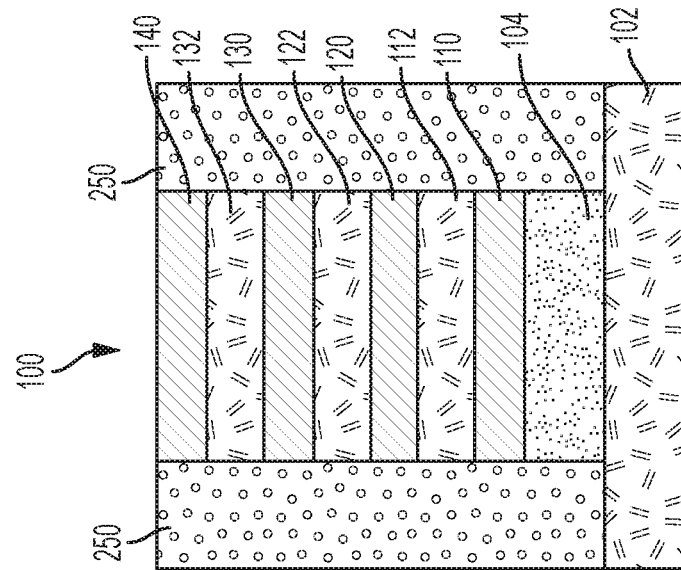
FIG. 1 depicts a cross sectional view of an exemplary initial nanosheet structure.

Turning now to a more detailed description of an embodiment of the present invention, a preliminary fabrication methodology for forming initial stages of a nanosheet resistor in accordance with one or more embodiments will now be described with reference to FIGS. 1 through 7F. Referring now to FIG. 1, an initial nanosheet structure 100 is illustrated. Nanosheet structure 100 contains a silicon substrate 102. A germanium buffer 104 is above silicon substrate 102. Atop germanium buffer 104 are alternating layers of epitaxially grown silicon germanium (SiGe) layers and epitaxially grown silicon (Si) layers. Illustrated in FIG. 1 are four layers of SiGe and three layers of Si. More particularly, the layers are SiGe layer 110, Si layer 112, SiGe layer 120, Si layer 122, SiGe layer 130, Si layer 132, and SiGe layer 140. It should be understood that other numbers of layers can be used and the structure shown in FIG. 1 is merely shown for illustrative purposes. The number of layers can be changed to achieve desired characteristics of the resulting structure.

Figure 2:
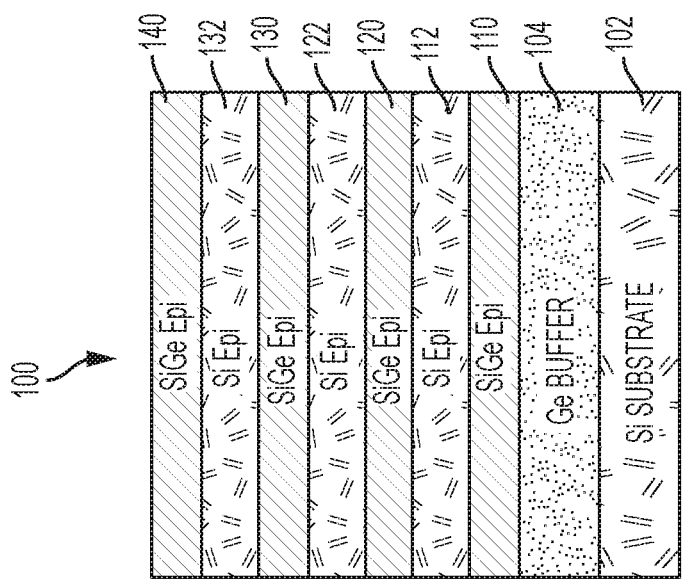
FIG. 2 depicts the nanosheet structure after an etch and dielectric oxide refill have been performed.

In FIG. 2, nanosheet structure 100 is illustrated after the next step is performed. An etch, such as a reactive ion etch, is performed to remove some of the material from layers 104, 110, 112, 120, 122, 130, 132, and 140. Thereafter, a fill is performed using inter-layer dielectric 250.

Figure 3:
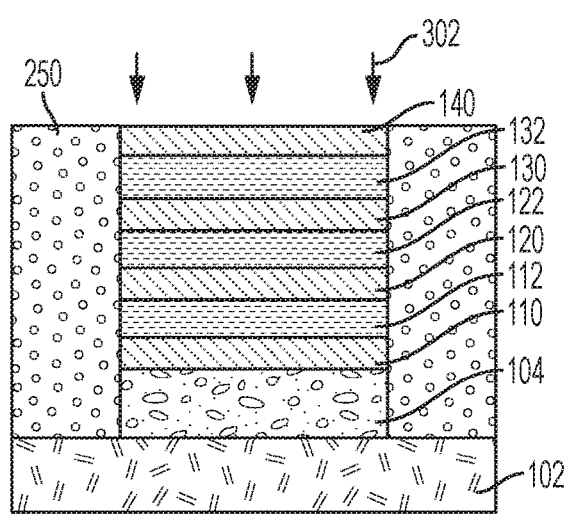
FIG. 3 depicts the nanosheet structure after an ion implantation.

Thereafter, an ion implantation is performed on nanosheet structure 100 and a thermal anneal is then performed. The resulting structure is illustrated in FIG. 3, with arrows 302 denoting the ion implantation. Layers 104, 110, 112, 120, 122, 130, 132, and 140 have implanted ions to adjust the conductivity of each of the layers. It should be understood that the ion implantation can be performed in a variety of different manners to achieve a desired level of conductivity of layers 104, 110, 112, 120, 122, 130, 132, and 140. Exemplary ion implantation methods can include phosphor doping at room temperature with 20 KeV acceleration voltage and 1E15 atoms/cm$^2$ dose, followed with rapid thermal process for dopant activation.

Figure 4:
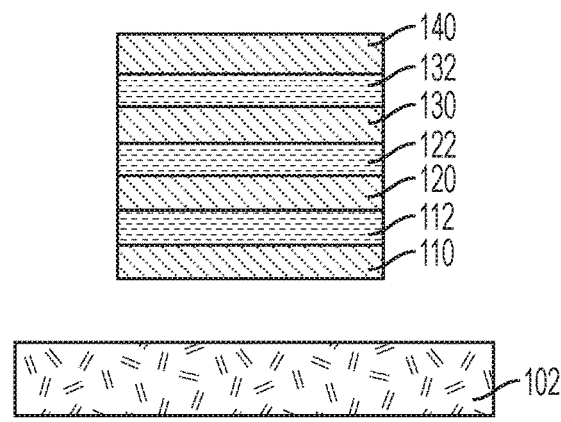
FIG. 4 depicts the nanosheet structure after the removal of an inter-layer dielectric and nanosheet stack-substrate buffer layer.

FIG. 4 illustrates the nanosheet structure after the completion of the next step, in which inter-layer dielectric 250 is removed. The removal can take place in one of a variety of different manners. In some embodiments, an anisotropic dry etch can be performed. The second steps shown on FIG. 4 is the selective Ge layer release using $H_2O_2$ Other methods can also be used.

Figure 5:
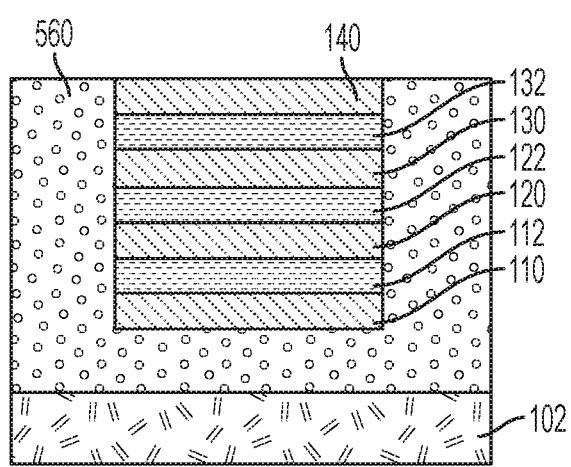
FIG. 5 depicts the nanosheet structure after a fill with a dielectric oxide.
Figure 6:
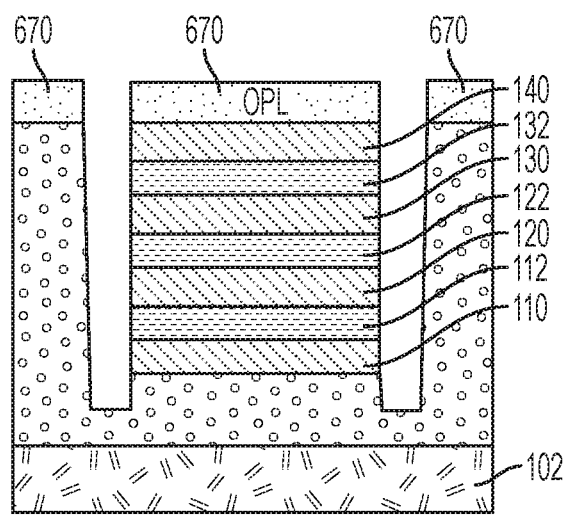
FIG. 6 depicts the nanosheet structure after an organic planarization layer has been placed on the structure.

FIG. 5 illustrates the result after nanosheet structure is filled with dielectric oxide 560. Thereafter, with the result shown in FIG. 6, organic planarization layer 670 is placed on certain areas of the structure so that an etch (such as a reactive ion etch) can be performed of dielectric oxide 560. Thereafter, a contact can be placed in the etched areas. A wide variety of materials can be used for the contact, such as metals like tungsten, cobalt, or ruthenium, or epitaxy materials.

Figure 7A:
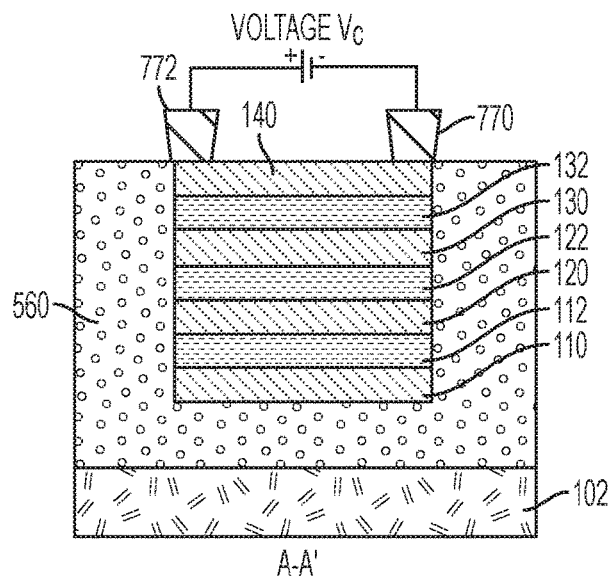
FIG. 7A depicts a cross-sectional view of the nanosheet structure.
Figure 7B:
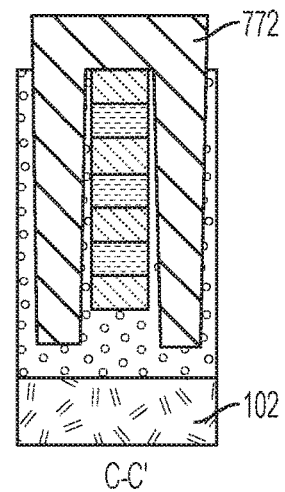
FIG. 7B depicts a cross-sectional view of the nanosheet structure.
Figure 7C:
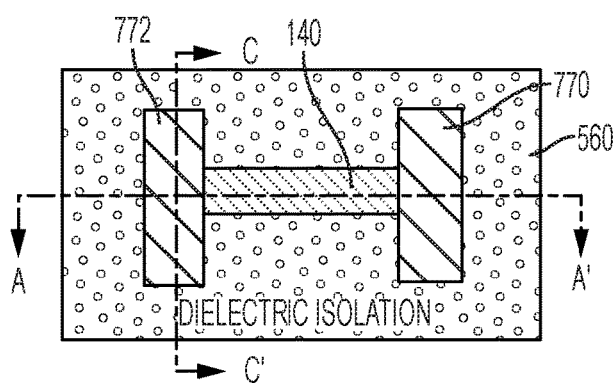
FIG. 7C depicts a plan view of the nanosheet structure.
Figure 7D:
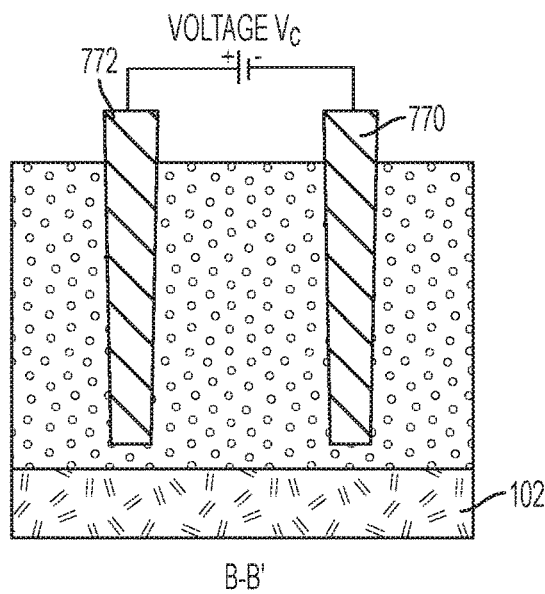
FIG. 7D depicts a cross-sectional view of the nanosheet structure.
Figure 7E:
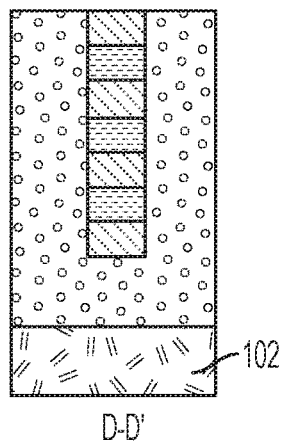
FIG. 7E depicts a cross-sectional view of the nanosheet structure.
Figure 7F:
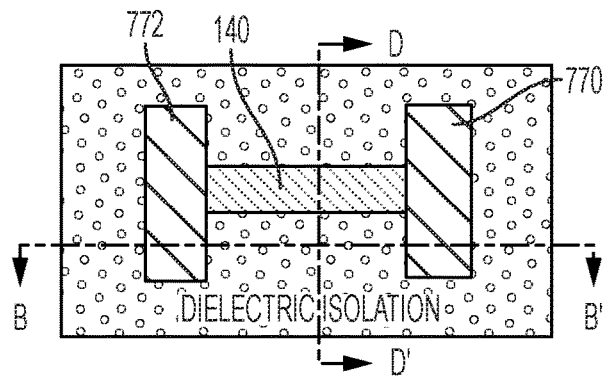
FIG. 7F depicts a plan view of the nanosheet structure.

FIGS. 7A through 7F illustrate a final structure of a nanosheet resistor using a direct gate contact. FIGS. 7C and 7F illustrate a plan view of structure 100. FIG. 7A illustrates a cross-section along line A-A'. FIG. 7B illustrates a cross-section along line C-C'. FIG. 7D illustrates a cross-section along line B-B'. FIG. 7E illustrates a cross-section along line D-D'. Present in FIGS. 7A through 7F are substrate 102, dielectric oxide 560, SiGe layer 110, Si layer 112, SiGe layer 120, Si layer 122, SiGe layer 130, Si layer 132, and SiGe layer 140. Also illustrated are metal contacts 770 and 772.

Figure 8:
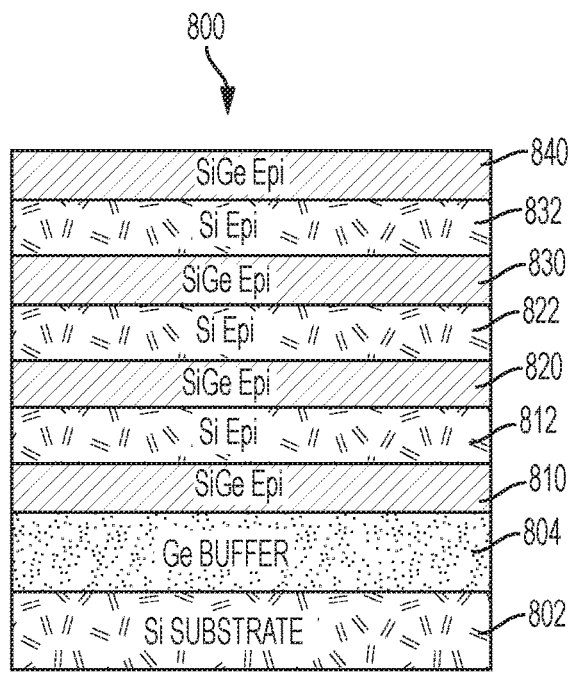
FIG. 8 depicts a cross sectional view of an exemplary initial nanosheet structure.

An alternative embodiment is shown in FIG. 8 through 14F. Referring now to FIG. 8, an initial nanosheet structure 800 is illustrated. Nanosheet structure 800 contains a silicon substrate 802. A germanium buffer 804 is above silicon substrate 802. Atop germanium buffer 804 are alternating layers of epitaxially grown silicon germanium (SiGe) layers and epitaxially grown silicon (Si) layers. Illustrated in FIG. 8 are four layers of SiGe and three layers of Si. More particularly, the layers are SiGe layer 810, Si layer 812, SiGe layer 820, Si layer 822, SiGe layer 830, Si layer 832, and SiGe layer 840. It should be understood that other numbers of layers can be used and the structure shown in FIG. 8 is merely shown for illustrative purposes. The number of layers can be changed to achieve desired characteristics of the resulting structure.

Figure 9:
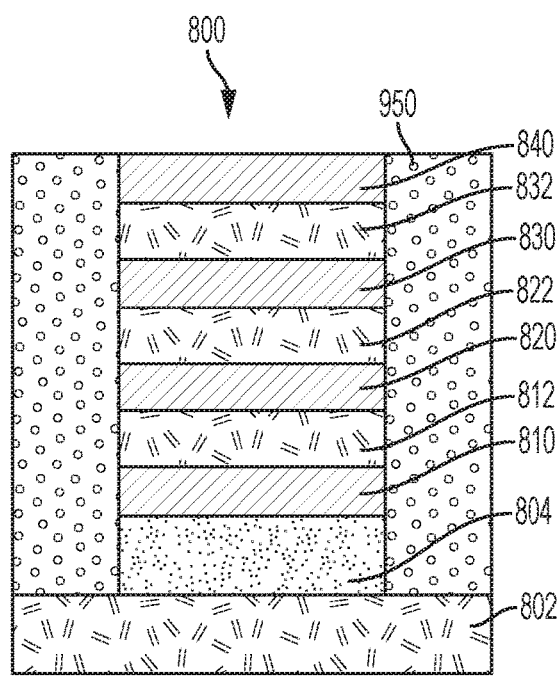
FIG. 9 depicts the nanosheet structure after an etch and dielectric oxide refill have been performed.

In FIG. 9, nanosheet structure 800 is illustrated after the next step is performed. An etch, such as a reactive ion etch, is performed to remove some of the material from layers 804, 810, 812, 820, 822, 830, 832, and 840. Thereafter, a fill is performed using inter-layer dielectric 950.

Figure 10:
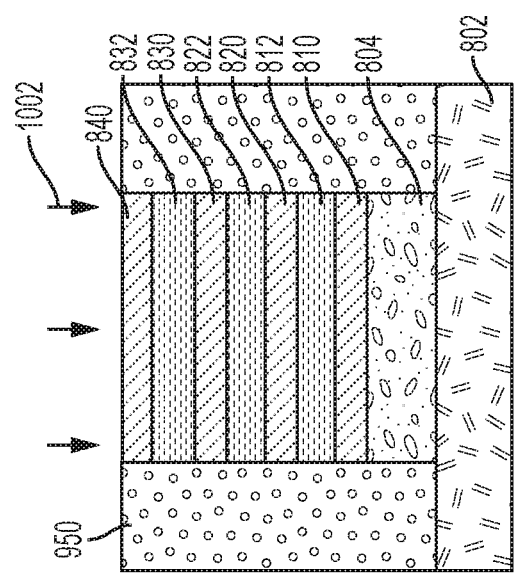
FIG. 10 depicts the nanosheet structure after an ion implantation.

Thereafter, an ion implantation is performed on nanosheet structure 800 and a thermal anneal is then performed. The resulting structure is illustrated in FIG. 10, with arrows 1002 denoting the ion implantation. Layers 804, 810, 812, 820, 822, 830, 832, and 840 have implanted ions to adjust the resistance of each of the layers. It should be understood that the ion implantation can be performed in a variety of different manners to achieve a desired level of conductivity of layers 804, 810, 812, 820, 822, 830, 832, and 840. Exemplary ion implantation methods can include phosphor doping at room temperature with 20 KeV acceleration voltage and 1E15 atoms/cm$^2$ dose, followed with rapid thermal process for dopant activation.

Figure 11:
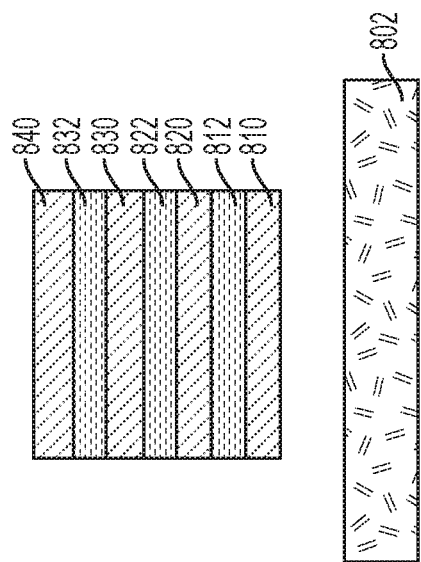
FIG. 11 depicts the nanosheet structure after the removal of an inter-layer dielectric and nanosheet stack-substrate buffer layer.

FIG. 11 illustrates the nanosheet structure after the completion of the next step, in which inter-layer dielectric 950 is removed. The removal can take place in one of a variety of different manners. In some embodiments, an anisotropic dry etch can be performed. Following that, a selective Ge release using $H_2O_2$ is performed. Other methods can also be used.

Figure 12:
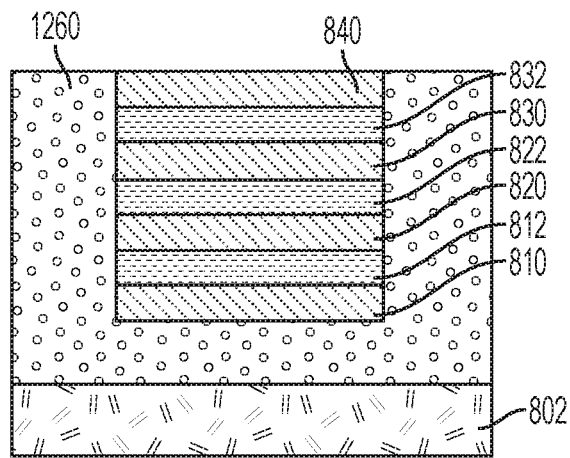
FIG. 12 depicts the nanosheet structure after a fill with a dielectric oxide.
Figure 13:
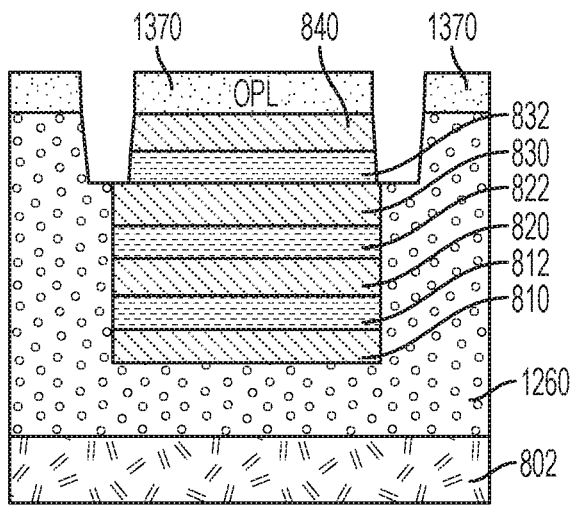
FIG. 13 depicts the nanosheet structure after an organic planarization layer has been placed on the structure.
Figure 14A:
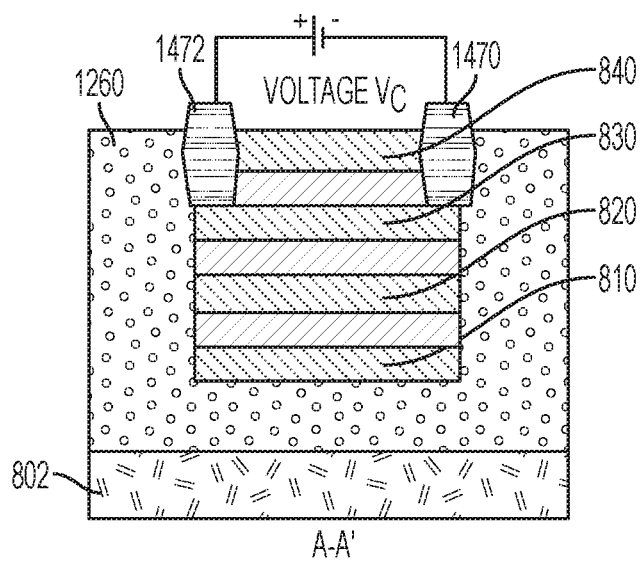
FIG. 14A depicts a cross-sectional view of the nanosheet structure.
Figure 14B:
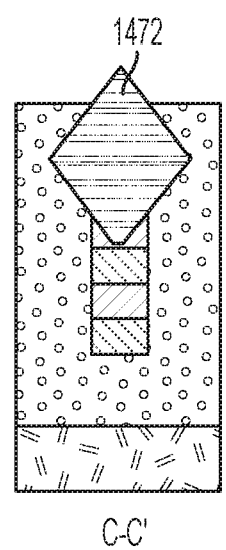
FIG. 14B depicts a cross-sectional view of the nanosheet structure.
Figure 14C:
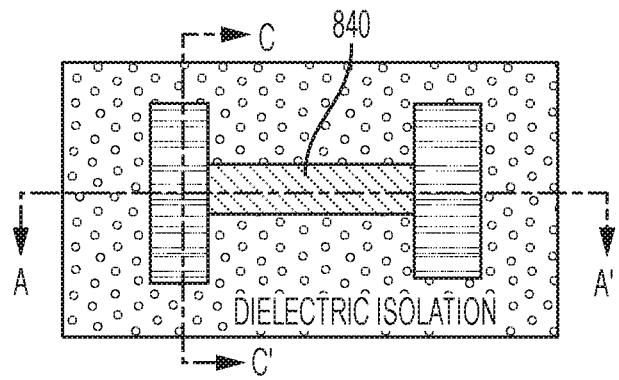
FIG. 14C depicts a plan view of the nanosheet structure.
Figure 14D:
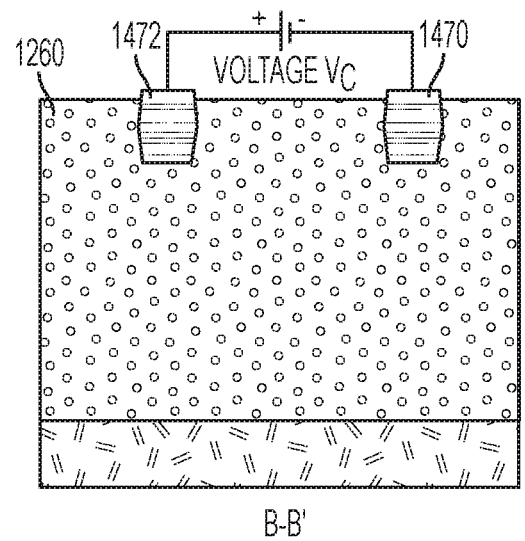
FIG. 14D depicts a cross-sectional view of the nanosheet structure.
Figure 14E:
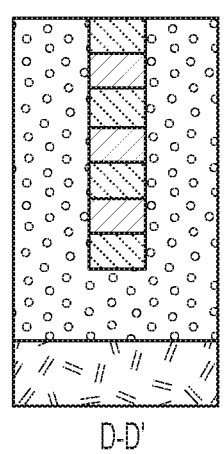
FIG. 14E depicts a cross-sectional view of the nanosheet structure.
Figure 14F:
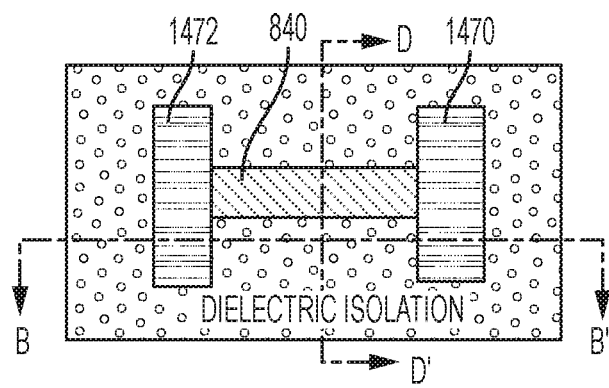
FIG. 14F depicts a plan view of the nanosheet structure.

FIG. 12 illustrates the result after nanosheet structure is filled with dielectric oxide 1260. Thereafter, with the result shown in FIG. 13, organic planarization layer 1370 is placed on certain areas of the structure so that an etch (such as a reactive ion etch) can be performed of dielectric oxide 1260. Unlike the structure shown in FIG. 6, the etch only goes as deep as two layers in FIG. 13. Thereafter, a contact can be placed in the etched areas. A wide variety of materials can be used for the contact, such as metals like tungsten, cobalt, or ruthenium, or epitaxy materials FIGS. 14A through 14F illustrate a final structure of a nanosheet resistor using a direct gate contact. FIGS. 14C and 14F illustrate a plan view of structure 1400. FIG. 14A illustrates a cross-section along line A-A'. FIG. 14B illustrates a cross-section along line C-C'. FIG. 14D illustrates a cross-section along line B-B'. FIG. 14E illustrates a cross-section along line D-D'. Present in FIGS. 14A through 14F are substrate 802, dielectric oxide 1260, SiGe layer 810, Si layer 812, SiGe layer 820, Si layer 822, SiGe layer 830, Si layer 832, and SiGe layer 840. Also illustrated are metal contacts 1470 and 1472.

Figure 15:
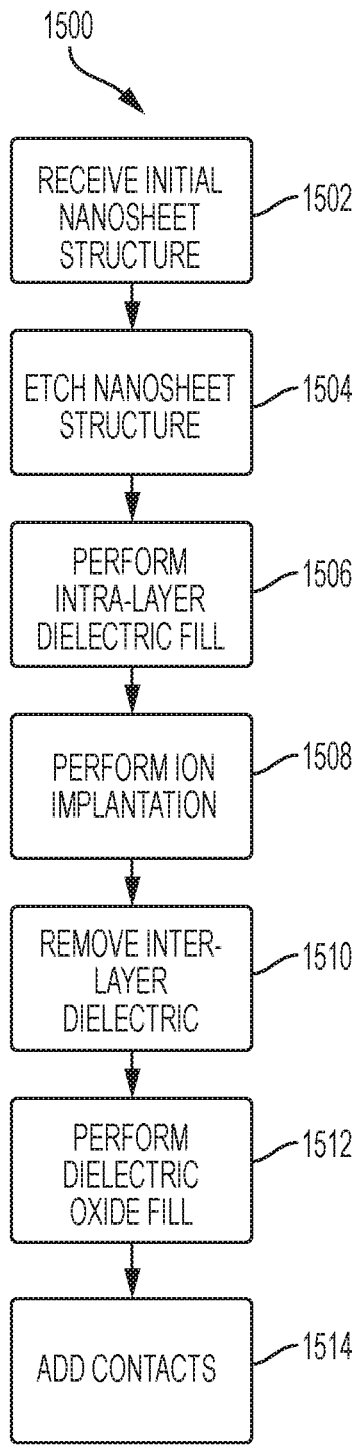
FIG. 15 is a flow diagram illustrating a methodology according to one or more embodiments.

FIG. 15 is a flow diagram illustrating a methodology 1500 according to one or more embodiments. At block 1502, a nanosheet containing alternating sheets of epitaxially deposited silicon and epitaxially deposited silicon germanium is provided. As stated above, the number of layers can be adjusted to form a structure with a variety of different ranges of resistance. This concept will be discussed in further detail below. At block 1504, an etching is performed on the nanosheet structure. At block 1506, an intra-layer dielectric fill can be performed. At block 1508, an ion implantation is performed, followed by a thermal anneal. This step changes the silicon and silicon germanium layers to create a certain level of conductivity in the silicon and silicon germanium layers. At block 1510, the inter-layer dielectric is removed. At block 1512, a dielectric oxide fill is performed. At block 1514, contacts can be added to the nanosheet structure.

An advantage of the structure described herein is the wide variety of resistances that can be achieved merely by connecting the nanosheet resistors in different manners. For example, it has been found that a parallel connection of 24 nanosheet resistors of a certain size can result in a resistance of 17 ohms, while the same nanosheet resistors connected in a serpentine series connection can result in a resistance of over 28,000 ohms. Through the various uses of parallel and series connections between the 24 resistors (or subset thereof), many different values between 17 ohms and 28,000 can be created. The nanosheet resistors also can be varied in length to create even greater variety in the resistance. Nanosheet resistors can have a wide range of sizes, for example from 150 to 500 nm in length. In addition, different numbers of nanosheet resistors can be used in various configurations. In such a manner, the wide variety of resistances can be created to result in a desired resistance value.

A comparison of the connection of nanosheet resistors is shown in FIGS. 16A and 16B. In FIG. 16A, a parallel connection of nanosheet resistors is shown. Each of nanosheet resistors 1610 is identical and each of which is coupled to metal coupling 1620 and 1622. The coupling can be of the type illustrated in FIGS. 7A-7F or of the type illustrated in FIGS. 14A-14F. Because of the parallel connection of the nanosheet resistors 1610, a very low resistance can be achieved. In contrast, FIG. 16B shows a series connection of nanosheet resistors. Nanosheet resistors 1660 are shown here. However, instead of a single metal coupling to which each nanosheet resistor is coupled, in FIG. 16B, each metal coupling only couples together two nanosheet resistors. Hence, coupling 1670 couples the first two resistors, coupling 1672 couples those two resistors to the next resistor, and so on up to coupling 1690. The end result is that each of the nanosheet resistors is coupled to each other in a series connection, resulting in a high resistance value between coupling 1670 and coupling 1690.

Thus, it can be seen from the forgoing detailed description and accompanying illustrations that embodiments of the present invention provide structures and methodologies for providing a resistor that occupies little space and can be created with a wide variety of different resistances.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There can be many variations to this diagram or the operations described therein without departing from the spirit of the invention. For instance, the operations can be performed in a differing order or operations can be added, deleted or modified. All of these variations are considered a part of the claimed invention.

While various embodiments have been described, it will be understood that those skilled in the art, both now and in the future, can make various modifications which fall within the scope of the claims which follow. These claims should be construed to maintain the proper protection for the invention first described.

What is claimed is:

1. An integrated circuit device comprising:
a substrate;
at least one linear resistor coupled to the substrate;
the linear resistor formed by:
    forming a nanosheet structure comprising alternating sheets of silicon and silicon germanium;
    performing an ion implantation on the nanosheet structure;
    placing a dielectric oxide around the nanosheet structure; and
    coupling a first contact and a second contact to the nanosheet structure to form the linear resistor between the first contact and the second contact.

2. The integrated circuit device of claim 1 wherein the linear resistor is further formed by:
etching the nanosheet structure prior to performing the ion implantation.

3. The integrated circuit device of claim 2 wherein the linear resistor is further formed by:
placing an organic planarization layer on areas that are not intended to be etched.

4. The integrated circuit device of claim 1 wherein the linear resistor is further formed by:
performing an intra-layer dielectric fill prior to performing the ion implantation.

5. The integrated circuit device of claim 1 wherein the linear resistor is further formed by:
performing a thermal anneal on the nanosheet structure; and
removing an intra-layer dielectric fill after the thermal anneal.

6. The integrated circuit device of claim 5 wherein the linear resistor is further formed by:
removing the intra-layer dielectric fill comprises using an etch technique to remove the dielectric fill.

7. The integrated circuit device of claim 1 further comprising:
a germanium buffer between the linear resistor and the substrate.

8. The integrated circuit device of claim 1 wherein:
the substrate is formed of silicon.

9. The integrated circuit device of claim 1 wherein:
coupling the first contact and the second contact to the nanosheet structure comprises:
etching a first area and a second area around the nanosheet structure; and
placing a conductive material in the first area around the nanosheet structure to serve as the first contact and a conductive material in the second area around the nanosheet structure to serve as the second contact.

10. The integrated circuit device of claim 1 further comprising:
coupling the first and second contacts to a second resistor in a configuration chosen from a series configuration or a parallel configuration to result in a desired resistance value.

11. A method of forming a linear resistor in an integrated circuit device, the method comprising:
forming a nanosheet structure comprising alternating sheets of silicon and silicon germanium;
performing an ion implantation on the nanosheet structure to adjust a conductivity of the nanosheet structure;
placing a dielectric oxide around the nanosheet structure; and
coupling a first contact and a second contact to the nanosheet structure to form the linear resistor between the first contact and the second contact.

12. The method of claim 11 further comprising:
etching the nanosheet structure prior to performing the ion implantation.

13. The method of claim 12 further comprising:
placing an organic planarization layer on areas that are not intended to be etched.

14. The method of claim 11 further comprising:
performing an intra-layer dielectric fill prior to performing the ion implantation.

15. The method of claim 11 further comprising:
performing a thermal anneal on the nanosheet structure; and
removing an intra-layer dielectric fill after the thermal anneal.

16. The method of claim 15 wherein:
removing the intra-layer dielectric fill comprises using an etch technique to remove the dielectric fill.

17. The method of claim 11 wherein:
the nanosheet structure is formed on a germanium buffer.

18. The method of claim 17 wherein:
the germanium buffer is on a silicon substrate.

19. The method of claim 11 wherein:
coupling the first contact and the second contact to the nanosheet structure comprises:
etching a first area and a second area around the nanosheet structure; and
placing a conductive material in the first area around the nanosheet structure to serve as the first contact and a conductive material in the second area around the nanosheet structure to serve as the second contact.

20. The method of claim 11 further comprising:
coupling the first and second contacts to a second resistor in a configuration chosen from a series configuration or a parallel configuration to result in a desired resistance value.

* * * * *